(12) United States Patent
Aoki et al.

(10) Patent No.: US 8,476,199 B2
(45) Date of Patent: Jul. 2, 2013

(54) RARE EARTH-TYPE TAPE-SHAPED OXIDE SUPERCONDUCTOR AND A COMPOSITE SUBSTRATE USED FOR THE SAME

(75) Inventors: Yuji Aoki, Tokyo (JP); Tsutomu Koizumi, Tokyo (JP); Yasuo Takahashi, Tokyo (JP); Atsushi Kaneko, Tokyo (JP); Takayo Hasegawa, Tokyo (JP); Hiroshi Nakamura, Tokya (JP)

(73) Assignees: International Superconductivity Technology Center, The Juridicial Foundation, Tokyo (JP); SWCC Showa Cable Systems Co., Ltd., Tokyo (JP)

( * ) Notice: Subject to any disclaimer, the term of this patent is extended or adjusted under 35 U.S.C. 154(b) by 832 days.

(21) Appl. No.: 12/528,413

(22) PCT Filed: Feb. 21, 2008

(86) PCT No.: PCT/JP2008/000295
§ 371 (c)(1),
(2), (4) Date: Aug. 24, 2009

(87) PCT Pub. No.: WO2008/105151
PCT Pub. Date: Sep. 4, 2008

(65) Prior Publication Data
US 2010/0099573 A1   Apr. 22, 2010

(30) Foreign Application Priority Data

Feb. 26, 2007 (JP) ................. 2007-044941

(51) Int. Cl.
*H01B 12/00* (2006.01)
(52) U.S. Cl.
USPC ........................ 505/237; 505/230; 505/236
(58) Field of Classification Search
USPC .................. 505/236, 237, 230; 428/699–702
See application file for complete search history.

(56) References Cited

U.S. PATENT DOCUMENTS

| 6,114,287 A * | 9/2000 | Lee et al. | |
| 6,610,632 B2 | 8/2003 | Honjo et al. | 505/237 |

(Continued)

FOREIGN PATENT DOCUMENTS

| JP | 04-329867 | 11/1992 |
| JP | 04-331795 | 11/1992 |
| JP | 2006-127847 | 5/2006 |
| JP | 2006-286212 | * 10/2006 |
| JP | 2007-115562 | 5/2007 |

OTHER PUBLICATIONS

Machine translation of JP 2006-286212, published Oct. 19, 2006.*

*Primary Examiner* — Colleen Dunn
(74) *Attorney, Agent, or Firm* — Bacon & Thomas, PLLC (57) ABSTRACT

This invention provides a rare earth-type tape-shaped oxide superconductor having excellent mechanical strength and superconducting properties and a composite substrate using for the same. Non-oriented and non-magnetic Ni-9 at % W alloy tapes (11, 21) were bonded onto both sides of a non-oriented and non-magnetic hastelloy tape (100) by a normal temperature bonding process, and an Ni-3 at % W alloy tape (12) having a cubic texture was bonded onto the surface of the tape (11) by a normal temperature bonding process. Thereafter, the heat-treatment was given in a reducing atmosphere and a bonding layer (50a) etc. was formed on the adhesive interface of each layer. Next, a (Ce, Gd)$O_2$ intermediate layer (13) and a $Ce_2Zr_2O_7$ intermediate layer (14) by an MOD process, a $CeO_2$ intermediate layer (15), a YBCO superconducting film (16) by a TFA-MOD method, and a silver stabilization layer (17) were stacked sequentially on the surface of the tape (12). A critical current value (Ic) of this superconductor showed 150 A.

14 Claims, 3 Drawing Sheets

U.S. PATENT DOCUMENTS

2006/0073975 A1* 4/2006 Thieme et al. ................ 505/125
2006/0116293 A1* 6/2006 Norton et al. ................ 505/237
2006/0276344 A1* 12/2006 Paranthaman et al. ....... 505/100
2007/0111893 A1* 5/2007 Kodenkandath et al. ..... 505/210

* cited by examiner

RARE EARTH-TYPE TAPE-SHAPED OXIDE SUPERCONDUCTOR AND A COMPOSITE SUBSTRATE USED FOR THE SAME

TECHNICAL FIELD

This invention relates to an oxide superconductor and a composite substrate which are suitable to the usage for an electric power cable, an electric power device such as an electric power storage system, and power equipment such as a motor. In particular, this invention relates to a rare earth-type tape-shaped oxide superconductor which is suitable to the oxide superconductor manufactured by using a film formation method (hereinafter called MOD method) of forming a ceramics thin layer onto a substrate by heating and baking a precursor film, and relates to a composite substrate used for the rare earth-type tape-shaped oxide superconductor.

BACKGROUND ART

As for the oxide superconductor, a critical temperature (Tc) is high compared with a conventional alloy system superconductor such as $Nb_3Sn$ system, and applied equipments such as electric power cable, transformer, motor, and electric power storage system can be operated under the liquid nitrogen temperature. Therefore, the making of the wire rod is studied energetically. Especially, in $ReBa_2Cu_3O_{7-y}$ (RE shows at least more than one kind of element selected from Y, Nd, Sm, Gd, Eu, Yb, Pr or Ho, and hereinafter called ReBCO) superconductor, because the reduction of the conducting current is small in the high magnetic field area, that is, because the magnetic-field property in the liquid nitrogen temperature is excellent compared with Bi system superconductor, the practical high critical current density (Jc) can be maintained. And, in addition to the excellent property in the high temperature area, because the manufacturing method which does not use silver of the precious metal is possible and the liquid nitrogen can be used as the refrigerant, the cooling efficiency improves remarkably. Therefore, it is extremely advantageous economically and the making of the wire rod is expected as the next-generation superconducting material.

Generally, the Re system oxide superconducting wire rod has the structure that at least one layer or plural layers of the biaxially-oriented oxide layer is formed onto the metal substrate, and the oxide superconducting layer is formed onto it, and further, the stabilizing layer which undertakes the role as the surface protection of the superconducting layer, the improvement of the electric contact, and the protection circuit in the excessive energization is stacked. In this case, it is known that the critical current property of the ReBCO wire rod depends on the in-plane orientation of the superconducting layer, and is influenced greatly by the intermediate layer which becomes the basic material, and the in-plane orientation and the smooth surface property of the oriented metal substrate.

The crystal system of the ReBCO superconductor is the rhombic crystal, and because the lengths of three sides of x axis, y axis and z axis are different and the angles among the three sides of the unit cell are also slightly different respectively, it is easy to form the twin crystal And because the slight gap of the azimuth generates the twin crystal grain boundary and reduces the conducting property, to bring out the property of the material in the conducting property, in addition to aligning of the CuO surface of the inside of the crystal, the aligning of the crystal orientation in the in-plane also is demanded. Therefore, the making of the wire rod has the difficulty compared with the Bi system oxide superconductor.

The manufacturing method of the making of the wire rod which improves the in-plane orientation of the crystal of the ReBCO superconductor and aligns the azimuth direction in the in-plane is same as the manufacturing method of the thin film. That is, the in-plane orientation and the azimuth direction of the crystal of the ReBCO superconducting layer is improved by forming the intermediate layer whose in-plane orientation and azimuth direction were improved onto the tape-shaped metal substrate and by using the crystal lattice of this intermediate layer as the template.

The ReBCO superconductor is studied in various manufacturing processes now, and various biaxially-oriented metal substrates which form the in-plane oriented intermediate layer onto the tape-shaped metal substrate are known.

Among these, at present, the process that the highest critical current property is shown is a method of using the MAD (Ion Beam Assisted Deposition) substrate. In this method, onto the polycrystalline high strength and non-magnetic tape-shaped Ni system substrate (hastelloy etc.), the particle generated from the target while irradiating the ion from a direction of the constant angle to the normal line of this Ni system substrate is deposited by pulsed laser deposition (PLO). And, the intermediate layer ($CeO_2$, $Y_2O_3$, YSZ etc.) or the intermediate layer of the double-layered structure (YSZ or $Rx_2Zr_2O_7/CeO_2$ or $Y_2O_3$ etc.: Rx shows Y, Nd, Sm, Gd, Ei, Yb, Ho, Tm, Dy, Ce, La or Er) which has the fine grain size and the high orientation and inhibits the reaction with the element which comprises the superconductor is formed. And, after forming the $CeO_2$ film onto it PLD method, $YBa_2Cu_3O_{7-y}$ (hereinafter called YBCO) layer is formed by PLD method or CVD method, and the superconducting wire rod is formed (for example, refer to Patent document No. 1 to No. 3).

However, in this process, because all intermediate layers are formed by the vacuum process in the gas phase method, although this process has the advantage that the dense and smooth intermediate layer film can be obtained, there are problems that the production speed is slow and the production cost rises. Although the processes of forming films by using sane gas phases other than this IBAD method have been studied, the effective means which solve the problems of the production speed and the production cost have not been reported.

The most effective process for attaining the low cost is the MOD process where the organic acid salt or the organic metallic compound is used as the raw material, and the oxide layer is formed by giving the thermal decomposition and the crystallization heat-treatment after coating this solution onto the surface of the substrate. Although this process is simple, because the long time heat-treatment in high temperature is necessary, according to the generation of cracks originating from the contraction in volume of film at the thermal decomposition, the non-uniform reaction by the imperfect of grain growth, and the decrease of the crystalline by such as the diffusion through the crystal grain boundary of the metallic element which constitutes the substrate, it was difficult to obtain the film having the function enough as the intermediate layer.

Generally, as the intermediate layer of the superconductor, although $CeO_2$ which is formed by PVD method is used as described above, because $CeO_2$ intermediate layer is excellent in the lattice consistency with the YBCO layer and in the oxidation resistance, and because the reactive property with the YBCO layer is small, this depends on what is known as one of the most excellent intermediate layer. When this $CeO_2$ intermediate layer is formed by MOD method, the cracks are generated depending on the large difference of the coefficient of thermal expansion with the metal of the substrate, and it becomes impossible to accomplish the function as the intermediate layer. Although the generation of cracks is inhibited when the film is formed using the solid solution that Gd is added to $CeO_2$ onto the Ni substrate by MOD method, because the diffusion of the element from Ni or Ni alloy substrate cannot be stopped in the inside of the intermediate layer, there was a problem that the superconducting property decreases. In order to prevent the diffusion of the element which constitutes this substrate, the study of the intermediate layer material that Gd is substituted to Zr is performed. The effect of preventing the diffusion is admitted, and the property of $Jc>1$ $MA/cm^2$ is obtained.

On the other hand, as the composite substrate which is excellent in the mechanical strength and the orientation, the following oriented substrate for film formation is known. That is, the non-oriented and non-magnetic first metal layer and the second metal layer which is pasted onto the first metal layer and has the texture whose surface layer at least is oriented are provided. And the first metal layer has the higher strength than the second metal layer. And this substrate has the high strength while maintaining the good orientation (for example, refer to Patent document No. 4).

Patent document No. 1: Japanese Patent Publication No. Hei04-329867
Patent document No. 2: Japanese Patent Publication No. Hei04-331795
Patent document No. 3: Japanese Patent Publication No. 2002-203439
Patent document No. 4: Japanese Patent Publication No. 2006-127847

DISCLOSURE OF THE INVENTION

Problem to be Solved by the Invention

In the MOD process as described above, when the IBAD substrate is not used, the biaxially-oriented substrate must be used. Therefore, as the substrate, Ni which is easy to form the texture and is excellent in the lattice consistency or Ni basis alloy including slight additive element is used. However, as the result of strong rolling for formation of the texture, because these substrates are thin in thickness and the amount of the additive element is few, when the heat-treatment for orientation is given at high temperature, there were problems that the mechanical strength decreases to approximately several ten-150 MPa, that the handling of subsequent film formation is influenced, and that in addition, it is not endured to the electromagnetic force when using the wire rod.

On the other hand, in above-described composite substrate which is excellent in the mechanical strength and the orientation, because the first metal layer and the second metal layer have the composition which is pasted mutually by the method of the rolling etc., in the handling of the subsequent film formation, there is a problem that the bonding strength is not enough.

This invention was conducted to solve the above-described problems And this invention aims to provide the rare earth-type tape-shaped oxide superconductor which is excellent in mechanical strength and in superconducting property, and the composite substrate used for the same.

Means for Solving the Problem

This invention was conducted to solve the above-mentioned problems. In a rare earth-type tape-shaped oxide superconductor that an intermediate layer of one layer or plural layers which comprises a biaxially-oriented inorganic material is formed onto a composite substrate and an oxide superconducting layer is provided onto this, the composite substrate comprises a metal substrate which becomes core material which is formed by non-oriented and non-magnetic metal, and comprises a first metal layer and a second metal layer which are arranged through a first bonding layer and a second bonding layer which are formed at both surfaces of this metal substrate by giving respectively a heat-treatment or a hot rolling after normal temperature bonding. And, at least a surface of the intermediate layer side of the first metal layer has a biaxially-oriented cubic texture, and a material which has a larger mechanical strength than a mechanical strengths of the first metal layer and second metal layer is used in the metal substrate.

Besides, the composite substrate which is used for the rare earth-type tape-shaped oxide superconductor of this invention comprises a metal substrate which becomes core material which is formed by non-oriented and non-magnetic metal, and comprises a first metal layer and a second metal layer which are arranged through a first bonding layer and a second bonding layer which are formed at both surfaces of this metal substrate by giving respectively a heat-treatment or a hot rolling after normal temperature bonding. And, at least one surface of the first metal layer or the second metal layer has a biaxially-oriented cubic texture, and a material which has a larger mechanical strength than the mechanical strengths of the first metal layer and second metal layer is used in the metal substrate.

In addition, the campsite substrate which is used for the rare earth-type tape-shaped oxide superconductor of this invention comprises a metal substrate which becomes core material which is formed by non-oriented and non-magnetic metal, and comprises a first metal layer and a second metal layer which are arranged through a first bonding layer and a second bonding layer which are formed at both surfaces of this metal substrate by giving respectively a heat-treatment or a hot rolling after normal temperature bonding, and which has a function for preventing a deformation of the composite substrate. The first metal layer is formed by plural layers which have a function for preventing a diffusion of an element from a metal substrate, and at least the surface has a biaxially-oriented cubic texture, and a material which has a larger mechanical strength than the mechanical strengths of the first metal layer and second metal layer is used in the metal substrate.

Effect of the Invention

According to this invention, the metal substrate which becomes the core material which is formed by non-oriented and non-magnetic metal, and the first metal layer and the second metal layer which are arranged at both surfaces of this metal substrate are bonded respectively through the first bonding layer and the second bonding layer which are formed by giving the heat-treatment or hot rolling after normal temperature bonding, and such the composite substrate is used. Therefore, the metal substrate, the first metal layer and the second metal layer are bonded strongly by the first bonding layer and the second bonding layer. Besides, the composite substrate has the composite structure that the metal substrate which becomes the core material which is formed by the non-oriented and non-magnetic metal having the larger mechanical strength than the mechanical strengths of the first metal layer and second metal layer is arranged at the inner side of the first metal layer and second metal layer. Therefore, the problem on the magnetic property of the superconductor can be avoided, and the deformation of the composite substrate is prevented in the subsequent film formation and the handling becomes easy, and further, the diffusion of the element from the metal substrate can be prevented.

In addition, at least the surface of the intermediate layer side of the first metal layer has the biaxially-oriented cubic texture. Therefore, onto this, the intermediate layer which comprises the high-oriented inorganic material and the oxide superconductor can be formed, and the rare earth-type tape-shaped oxide superconductor which has the excellent superconducting property can be obtained.

BEST MODE FOR CARRYING GOT THE INVENTION

Figure 1:
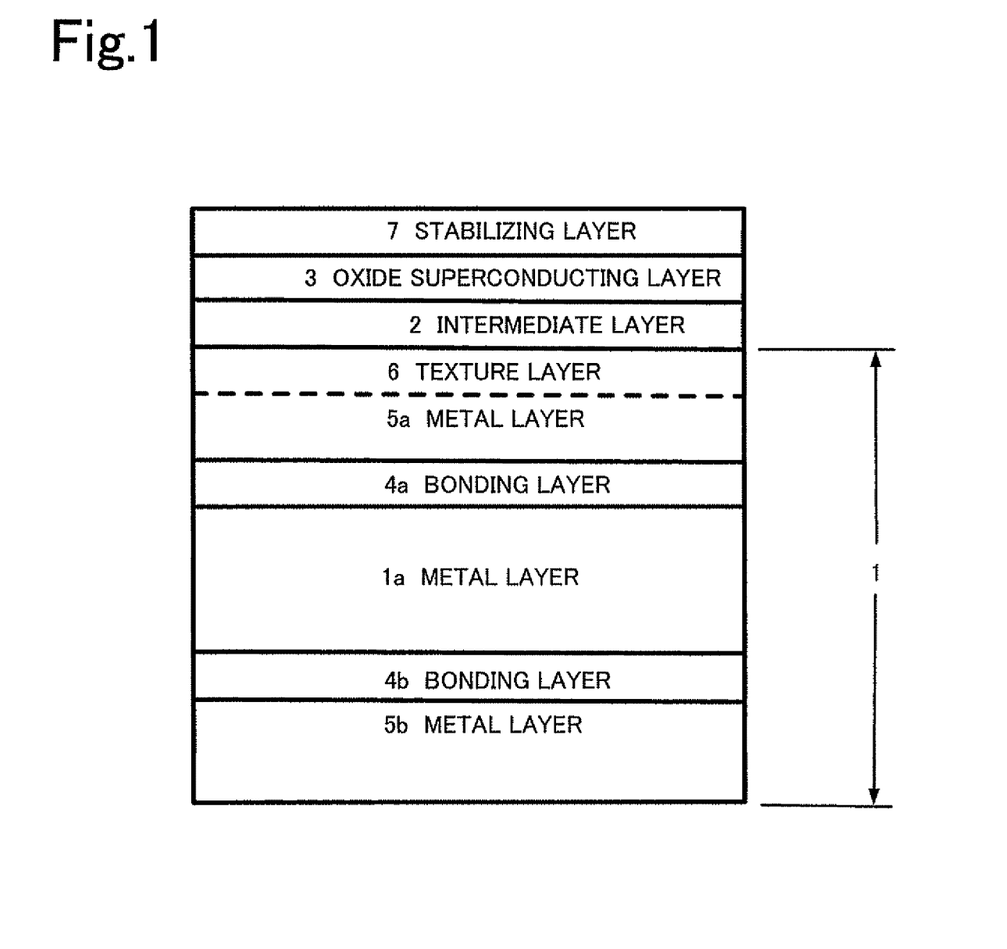
FIG. 1 The cross-sectional view which is perpendicular to the axial direction of the tape, which shows one embodiment of the rare earth-type tape-shaped oxide superconductor and the composite substrate used for the same of this invention.

As shown in FIG. 1, in the rare earth-type tape-shaped oxide superconductor of this invention, on the metal substrate 1a which becomes the core material which is formed by the non-oriented and the non magnetic metal, and the composite substrate which comprises the first metal layer 5a and the second metal layer 5b which are arranged on both surfaces of this metal substrate 1a, the intermediate layer 2 which comprises the biaxially-oriented inorganic material is formed in one layer or plural layers, and the oxide superconductor 3 is provided onto this. The metal substrate 1a which becomes the core material, and the first metal layer 5a and the second metal layer 5b which are arranged respectively on both surfaces of this metal substrate 1a are bonded strongly by the first bonding layer 4a and the second bonding layer 4b which are formed by the heat-treatment or the hot rolling after normal temperature bonding, and there is the function which prevents the deformation of the composite substrate 1. Therefore, it is preferable that the first metal layer 5a and the second metal layer 5b have the almost equal coefficient of thermal expansion. In addition, the metallic stabilizing layer 7 which comprises silver etc. is accumulated.

The first bonding layer 4a and the second bonding layer 4b can be formed by giving the heat-treatment and the hot rolling after normal temperature bonding. This normal temperature bonding is well known process conventionally, and generally, this is called, the surface activated bonding. The argon ion beam (even the hydrogen radical is acceptable) is irradiated to the material that the smoothness degree of surface is Ra=5 nm or less by electropolishing the surface preliminarily in the high vacuum ($10^{-8}$ Pa) atmosphere, and the bonding is performed by the pressure-bonding in the pressure of 100 MPa (refer to Materia, Vol. 35, No. 5, 1996).

The heat-treatment is given after above-described normal temperature bonding. This heat-treatment is given to inhibit the influence of the interface by the fine amorphous layer or the fine crystalline grain which is formed between the layers after bonding and to form the uniform and strong bonding layer by the diffusion of the element. The heat-treatment in this case is performed in the reduction atmosphere or the inert atmosphere.

Figure 2:
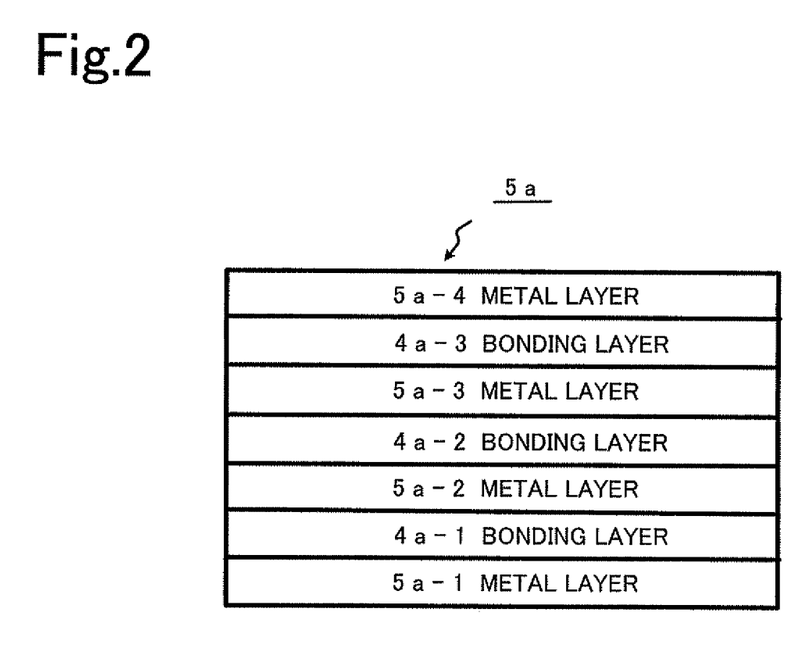
FIG. 2 The cross-sectional view which is perpendicular to the axial direction of the tape, which shows one embodiment of the first metal layer which is used for this invention.

Among the above-described first metal layer 5a and second metal layer 5b, at least the first metal layer 5a of the intermediate layer 2 side has the function to prevent the diffusion of the constituent element of the metal substrate 1a to the intermediate layer 2 and the oxide superconducting layer 3, and the surface of the intermediate layer 2 side of the first metal layer 5a has the biaxially-oriented cubic texture 6. Although it is possible that the first metal layer 5a is a single layer, it is preferable that this first metal layer 5a is formed by the plural layers which are bonded mutually, and has the biaxially-oriented cubic texture 6 at least at the surface of the intermediate layer 2 side. Also as well as above-mentioned, this bonding can be given the heat-treatment or the hot rolling after normal temperature bonding. For example, as shown in FIG. 2, the first metal layer is composed by 5a-1, 5a-2, 5a-3 and 5a-4 of 4 layers, and bonded mutually by 4a-1, 4a-2 and 4a-3 of the bonding layer by the heat-treatment or the hot rolling after normal temperature bonding, and only 5a-4 of the outermost layer can be also composed to have the biaxially-oriented cubic texture.

As the above-described metal substrate, the material which has the larger mechanical strength than the mechanical strength of the first metal layer and the second metal layer is used, and the usage of nickel basis alloy or stainless steel is preferable as such the material. As such nickel basis alloy, the one that one or more kinds of additive element selected from tungsten, molybdenum, chromium, iron, cobalt, vanadium and manganese are included into nickel can be used.

Besides, as for the first metal layer 5a and the second metal layer 5b, it is preferable to use nickel basis alloy which includes one or more kinds of additive element selected from tungsten, molybdenum, chromium, iron, cobalt, vanadium, manganese, copper and silver into nickel. When the first metal layer 5a is formed by the plural layers, the component that the additive amount of the alloy element into nickel basis alloy of each layer reduces gradually toward the intermediate layer 2 side from the first bonding layer 4a is preferable.

In this case, as for the additive amount of the alloy element into nickel basis allay, it is preferable that the range that the magnetic property of nickel basis alloy disappears in at least the layer which contacts to the first bonding layer 4a is used, and that the range that the cubic texture of nickel basis alloy is formed easily in at least the layer which contacts to the intermediate layer 2 is used. For example, the range to exceed 8 at % in at least the layer contacting to the first bonding layer 4a of the former is preferable, and the range of less than 6 at % in at least the layer contacting to the intermediate layer 2 of the latter is preferable.

The intermediate layer 2 on the composite substrate 1 comprises the biaxially-oriented inorganic material, and it is formed on the one-layered structure or the plural-layered structure. For example, in the case of the one-layered structure, the intermediate layer (B) which comprises $CeO_2$ film or Ce—Gd—O film whose Gd is added to this is formed. And, in the case of the plural-layered structure, the intermediate layer (A) which includes one element selected from Ce, Gd or Sm, and Zr between this intermediate layer (B) and the composite substrate is formed.

As for the above-described intermediate layer 2, the one-layered structure is adopted when being able to maintain the temperature of the substrate with low temperature in the case of forming the superconducting film by the gas phase method, and the double-layered structure is preferable when forming the superconducting film with high temperature by such as MOD method or CVD method.

The film of the above-described intermediate layer (A) can be formed by any method of MOD method, pulsed-laser deposition technique, sputter technique or CVD method. When forming by MOD method, it is formed by giving the heat-treatment after coating the mixed solution of the octylic acid salt, the naphthenate, the neodecanoic acid salt or the trifluoroacetate and so on which include the element which constructs the intermediate layer. And, they should be able to be dissolved uniformly into the organic solvent of one kind or more than two kinds and coated onto the substrate. It is preferable that the metal element content of this mixed solution is 0.08-0.5 mol/l, and especially, it is preferable that it is 0.1-0.3 mol/l. When this metal element content is less than 0.08 mol/l, because the oxide film which is formed by one coating and the heat-treatment becomes thin, the uniform intermediate layer cannot be formed. And, when the metal element content exceeds 0.5 mol/l, because the oxide film which is formed with one time becomes thick, the smoothness of surface not only is damaged but also the crystalline property decreases.

Although the film thickness of the intermediate layer (A) is controlled by repeating the number of times of the coating process and the heat-treatment process, it is effective to obtain the desired thickness by coating of 3-5 times considering the smoothness of surface. And, it is preferable that the film thickness is 30 nm-300 nm. As the coating method, although such as the dip coat method, the spin coat method, the ink-jet method is enumerated, if the film can be uniformly formed onto the substrate, it is not restricted by this example.

In the case of forming the intermediate layer with the double-layered structure, the film of $CeO_2$ or Ce—Gd—O can be formed by MOD method as well as above-described intermediate layer (A), or by any method of the pulsed-laser deposition technique, the sputter technique or the CVD method. And it is preferable that the additive amount of Gd an Ce—Gd—O film is 50 at % or less with the element content of metal. If the additive amount of Gd exceeds 50 at %, the crystalline system changes. When the YBCO superconducting film is formed onto this, the good orientation cannot be obtained. It is preferable that this film thickness is 50 nm-3 μm. In this reason, there is the possibility that when the film thickness is less than 50 nm, the effect for the prevention of the elemental diffusion of the substrate is small, and when the film thickness exceeds 3 μm, the crack occurs.

The YBCO superconducting film whose critical current density (Jc) is 1 $MA/cm^2$ or more can be obtained by forming the YBCO superconducting film on to the above-described intermediate layer (B). In this film forming process, any method of the MOD method, the pulsed-laser deposition technique, the sputter technique or the CVD method can be used.

As for the raw material which forms the YBCO superconducting film by MOD method, the organic acid salt or the organic metallic compound including Y, Ba and Cu with predefined molar ratio is used. The ratio of the number of moles is Y:Ba:Cu=1: (2+a):(3+b), and, a and b is 0.01<a<0.3 and 0.01<b<0.5. When the number of moles is the range other than this range, the problems that the formation of the superconducting layer is impossible or many impurities are generated occur. As the MOD raw material, for example, although the octylic acid salt, the naphthenate, the neodecanoic acid salt or the trifluoroacetate and so on of each element are enumerated, they should be able to be dissolved uniformly into the organic solvent of one kind or more than two kinds and coated onto the substrate.

Hereinafter, the embodiment of this invention is explained.

Embodiment

Hereinafter, the embodiment and the comparative example of this invention are explained.

Embodiment

Figure 3:
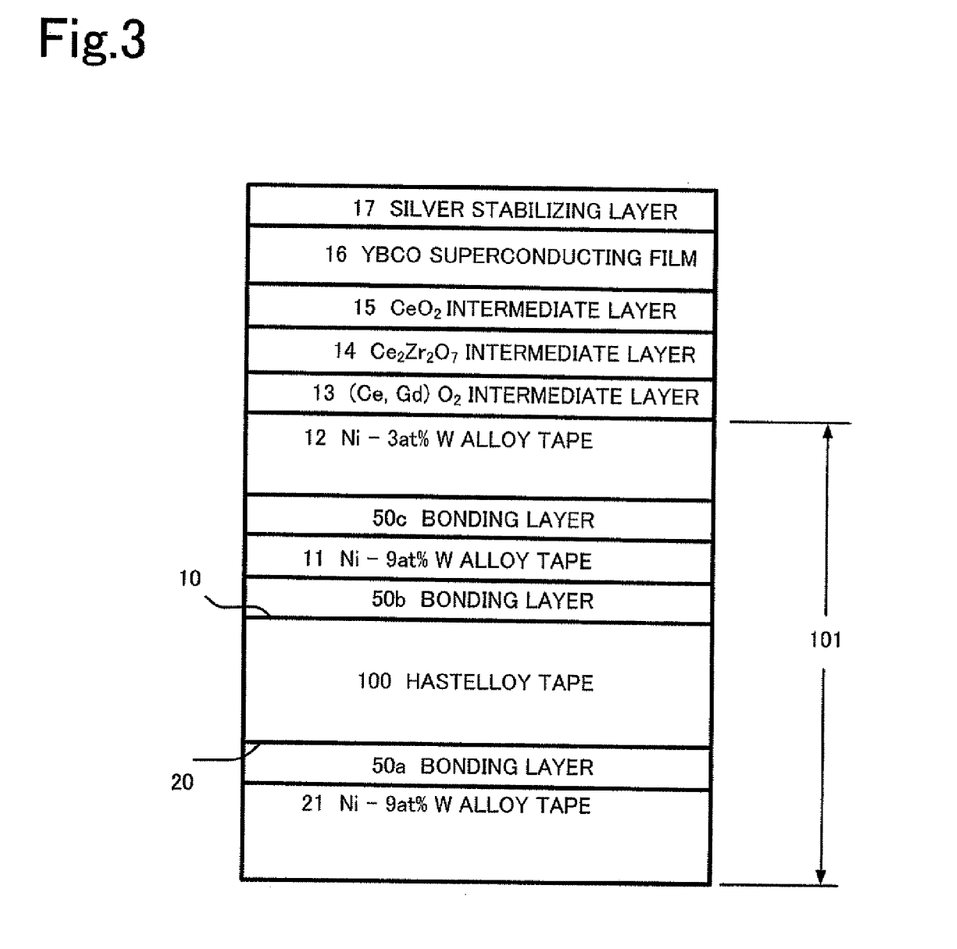
FIG. 3 The cross-sectional view which is perpendicular to the axial direction of the tape, which shows one embodiment of the rare earth-type tape-shaped oxide superconductor of this invention.

As shown in FIG. 3, the non-oriented and non-magnetic Ni-9 at % W alloy tape 11 having the thickness of 30 μm$^t$ was bonded on the surface 10 of the non-oriented and non-magnetic hastelloy tape 100 having the thickness of 100 μm$^t$ and the non-oriented and non-magnetic Ni-9 at % W alloy tape 21 having the thickness of 60 μm$^t$ was bonded on the surface 20 of the hastelloy tape 100 by the normal temperature bonding process. After that, the Ni-3 at % W alloy tape 12 having the thickness of 30 μm$^t$ was bonded on the surface of the tape 11.

As for the tape 12, the predefined processing and heat-treatment was given so as to have the cubic texture.

The heat-treatment was given to the composite tape 101 of the four-layered structure which was bonded mutually in this way with 8 hours at 500° C. in the reduction atmosphere of Ar-4% $H_2$, and the diffusion layers, that is, the bonding layers 50a, 50b and 50c were formed at the bonding interface of each layer. The thicknesses of these bonding layers were 1 μm or less.

The intermediate layer 13 which comprises (Ce, Gd) $O_2$ and has the thickness of 10 nm and the intermediate layer 14 which comprises $Ce_2Zr_2O_7$ and has the thickness of 200 nm were formed in sequence on the surface of the Ni-3 at % W alloy tape 12 having the cubic texture of the above-described composite tape 101 by MOD process. After that, in addition, the intermediate layer 15 which comprises $CeO_2$ and has the thickness of 150 nm was formed onto that.

After that, the YBCO superconducting film 16 was formed on the surface of the above-described intermediate layer 15 by TFA-MOD method, and the stabilizing layer 17 which comprises silver and has the thickness of 20 μm was evaporated on the surface of this YBCO superconducting film 16.

The film thickness of the YBCO superconducting film 16 which was obtained in this way was 1.5 μm and the critical current value (Ic) showed the value of 150 A.

Comparative Example

As well as embodiment, the non-oriented and non-magnetic Ni-9 at % W alloy tape 11 having the thickness of 30 μm$^t$ was bonded on the surface 10 of the non-oriented and non-magnetic hastelloy tape 100 having the thickness of 100 μm$^t$ and the non-oriented and non-magnetic Ni-9 at % W alloy tape 21 having the thickness of 60 μm$^t$ was bonded on the surface 20 of the hastelloy tape 100 by the normal temperature bonding process. After that, the Ni-3 at % W alloy tape 12 having the thickness of 30 μm$^t$ was bonded on the surface of the tape 11.

As for the tape 12, the predefined processing and heat-treatment was given so as to have the cubic texture.

The rewinding process was given to the composite tape 101 of the four-layered structure which was bonded mutually in this way by bridging it between reels of the winding diameter of 100 min. Thereby, the detachment phenomenon was observed at the interface between the hastelloy 100 and the Ni-9 at % W alloy tape 11, 21, and the interface between the Ni-9 at % W alloy tape 11 and the Ni-3 at % W alloy tape 12. According to the result of the observation of the detached part, in the surface activation treatment process of the material by the argon ion etching in the normal temperature bonding process, it became clear that the surface roughness of the Ni-9 at % W alloy tape 11, 21 and the Ni-3 at % W alloy tape 12 became rough from Ra=5 nm or less to 150 nm in the smoothness degree of surface after the electrochemical polishing process. This is considered to be the result of the generation of the selective etching which depends on the thing that the sputtering rate by the argon ion is different according to the crystal orientation of the Ni—W alloy tape. Therefore, because the bonding surface after the normal temperature bonding process is not the surface adhesion but the spot adhesion, it is considered that the detachment phenomenon was generated by the repetitive bending strain.

On the other hand, when the heat-treatment was given to form the bonding layer (diffusion layer) after the normal temperature bonding process, as the result that the uniform bonding layer was formed, the detachment phenomenon was not recognized (embodiment).

INDUSTRIAL APPLICABILITY

In the rare earth-type tape-shaped oxide superconductor and the composite substrate used for the same according to this invention, the utilization to the oxide superconductor which is suitable to the usages to the electric power cable, the electric power equipment such as the electric power storage system and the power equipment such as the motor is possible.

The invention claimed is:

1. A rare earth-type tape-shaped oxide superconductor, comprising:
    a composite substrate comprising a metal substrate which is formed of non-oriented and non-magnetic metal, a first metal layer, and a second metal layer, said first and second metal layers being respectively bonded to opposing surfaces of said metal substrate through a first bonding layer and a second bonding layer, respectively;
    at least one intermediate layer of a biaxially-oriented inorganic material formed on a surface of said first metal layer of said composite substrate; and
    a rare earth oxide superconductive layer formed on said intermediate layer;
    wherein the first and second bonding layers are formed by surface activated bonding at normal temperature, followed by a heat-treatment or hot rolling,
    wherein said first metal layer comprises plural layers mutually bonded by surface activated bonding, followed by a heat-treatment or hot rolling,
    wherein said first metal layer has first and second opposing surfaces,
    wherein said first surface of said first metal layer faces said intermediate layer,
    wherein said second surface of said first metal layer is bonded to said metal substrate through said second bonding layer,
    wherein at least said first surface of said first metal layer has a biaxially-oriented cubic texture, and
    wherein said metal substrate has a larger mechanical strength than that of said first and second metal layers.

2. A rare earth-type tape-shaped oxide superconductor according to claim 1,
    wherein the first metal layer and the second metal layer function to prevent deformation of the composite substrate and at least the first metal layer functions to prevent diffusion of an element from the metal substrate.

3. A rare earth-type tape-shaped oxide superconductor according to claim 1,
    wherein the metal substrate comprises a nickel-base alloy or a stainless steel.

4. A rare earth-type tape-shaped oxide superconductor according to claim 3,
    wherein the metal substrate comprises a nickel-base alloy comprising nickel and one or more alloying elements selected from tungsten, molybdenum, chromium, iron, cobalt, vanadium and manganese.

5. A rare earth-type tape-shaped oxide superconductor according to claim 4,
    wherein the first metal layer and the second metal layer comprise a nickel-base alloy comprising nickel and one or more alloying elements selected from tungsten, molybdenum, chromium, iron, cobalt, vanadium, manganese, copper and silver.

6. A rare earth-type tape-shaped oxide superconductor according to claim 1,
    wherein the first metal layer comprises a nickel-base alloy comprising nickel and one or more alloying elements selected from tungsten, molybdenum, chromium, iron, cobalt, vanadium, manganese, copper and silver, and
    wherein an additive amount of the alloying elements in the nickel-base alloy of each layer reduces gradually toward the intermediate layer from the first bonding layer.

7. A rare earth-type tape-shaped oxide superconductor according to claim 6,
    wherein the additive amount of the alloying elements in the nickel-base alloy is within a range that a magnetic property of the nickel-base alloy disappears in at least the layer which contacts the first bonding layer, and is added within a range that a cubic texture of the nickel-base alloy is formed easily in at least the layer which contacts the intermediate layer.

8. A rare earth-type tape-shaped oxide superconductor according to claim 7,
    wherein the additive amount of the alloying elements in the nickel-base alloy exceeds 8 at % in at least the layer which contacts the first bonding layer, and is less than 6 at % in at least the layer which contacts the intermediate layer.

9. A composite substrate for a rare earth-type tape-shaped oxide superconductor, comprising:
    a metal substrate which is formed of non-oriented and non-magnetic metal; and
    a first metal layer and a second metal layer which are respectively bonded to opposing surfaces of said metal substrate through a first bonding layer and a second bonding layer, respectively; and
    wherein the first and second bonding layers are formed by surface activated bonding at normal temperature, followed by a heat-treatment or hot rolling,
    wherein the first and second bonding layers are formed by surface activated bonding at normal temperature, followed by a heat-treatment or hot rolling,
    wherein said first metal layer comprises plural layers mutually bonded by surface activated bonding, followed by a heat-treatment or hot rolling,
    wherein said first metal layer has first and second opposing surfaces,
    wherein at least said first surface of said first metal layer has a biaxially-oriented cubic texture,
    wherein said second surface of said first metal layer is bonded to said metal substrate through said second bonding layer, and
    wherein said metal substrate has a larger mechanical strength than that of said first and second metal layers.

10. A composite substrate for a rare earth-type tape-shaped oxide superconductor, comprising:
    a metal substrate which is formed of non-oriented and non-magnetic metal; and
    a first metal layer and a second metal layer which are respectively bonded to opposing surfaces of said metal substrate through a first bonding layer and a second bonding layer, respectively, and which function to prevent deformation of the composite substrate; and wherein the first and second bonding layers are formed by surface activated bonding at normal temperature, followed by a heat-treatment or hot rolling, wherein said first metal layer is formed of plural layers and functions to prevent diffusion of an element from said metal substrate, wherein said plural layers of said metal layer are mutually bonded surface activated bonding, followed by a heat-treatment or hot rolling, wherein said first metal layer has first and second opposing surfaces, wherein at least said first surface of said first metal layer has a biaxially-oriented cubic texture, wherein said second surface of said first metal layer is bonded to said metal substrate through said second bonding layer, and wherein said metal substrate has a larger mechanical strength than that of said first and second metal layers.

11. A composite substrate for a rare earth-type tape-shaped oxide superconductor according to claim 10,
wherein the metal substrate, the first metal layer and the second metal layer comprise a nickel-base alloy.

12. A composite substrate for a rare earth-type tape-shaped oxide superconductor according to claim 11,
wherein the plural layers of the first metal layer are formed of the nickel-base alloy and wherein an additive amount of an element alloying with the nickel reduces gradually toward an outermost layer, among the plural layers, from a layer which contacts the first bonding layer.

13. A composite substrate for a rare earth-type tape-shaped oxide superconductor according to claim 12,
wherein the additive amount of the alloy elements in the nickel-base alloy exceeds 8 at % in at least the layer, among the plural layers, which contacts the first bonding layer, and is less than 6 at % in at least the outermost layer among the plural layers.

14. A composite substrate for a rare earth-type tape-shaped oxide superconductor according to claim 9,
wherein the metal substrate, the first metal layer and the second metal layer comprise a nickel-base alloy.

* * * * *